(12) United States Patent
Page et al.

(10) Patent No.: US 8,125,193 B2
(45) Date of Patent: Feb. 28, 2012

(54) METHOD OF TESTING AN ELECTROCHEMICAL DEVICE

(75) Inventors: Shannon Charles Page, Christchurch (NZ); Adnan Al-Anbuky, Christchurch (NZ); Susan Pran Krumdieck, Christchurch (NZ)

(73) Assignee: Eaton Power Quality Company, Christchurch (NZ)

( * ) Notice: Subject to any disclaimer, the term of this patent is extended or adjusted under 35 U.S.C. 154(b) by 937 days.

(21) Appl. No.: 10/599,123

(22) PCT Filed: Mar. 24, 2005

(86) PCT No.: PCT/NZ2005/000053
§ 371 (c)(1),
(2), (4) Date: Jun. 5, 2008

(87) PCT Pub. No.: WO2005/093447
PCT Pub. Date: Oct. 6, 2005

(65) Prior Publication Data
US 2008/0238430 A1  Oct. 2, 2008

(30) Foreign Application Priority Data
Mar. 26, 2004  (NZ) ........................................ 531978

(51) Int. Cl.
*H02J 7/00* (2006.01)
*G06F 17/00* (2006.01)
*G01R 25/00* (2006.01)
*G01N 27/416* (2006.01)

(52) U.S. Cl. ............ 320/136; 320/134; 324/426; 702/65

(58) Field of Classification Search .................. 320/136, 320/134; 324/426; 702/65
See application file for complete search history.

(56) References Cited

U.S. PATENT DOCUMENTS

| | | | |
|---|---|---|---|
| 6,160,382 A * | 12/2000 | Yoon et al. | ..................... 320/136 |
| 6,214,487 B1 | 4/2001 | Kelley et al. | |
| 6,519,539 B1 | 2/2003 | Freeman et al. | |
| 6,620,538 B2 | 9/2003 | Bai et al. | |

(Continued)

OTHER PUBLICATIONS

Slade S, Campbell SA, Ralph TR, Walsh FC, Ionic conductivity of an extruded Nafion 1100 EW series of membranes, Journal of the Electrochemical Society, 149 (12): A1556-A1564 Dec. 2002.

(Continued)

*Primary Examiner* — Helen O Conley
(74) *Attorney, Agent, or Firm* — Myers Bigel Sibley & Sajovec, P.A.

(57) ABSTRACT

Methods and associated apparatus for testing an electrochemical device, such as a fuel cell. A first method involves charging the fuel cell during a charge period; discharging the fuel cell during a discharge period; and monitoring the response of the fuel cell during at least part of the discharge period or the open-circuit response of the fuel cell. Another method involves testing the fuel cell when the fuel cell is in a passive state in which substantially no electrochemical reactions are taking place in the fuel cell. simultaneously applying a stimulus to all of the devices, and independently monitoring the response of each of the devices to the stimulus. Further methods involve obtaining test data from a device being tested; obtaining equivalent circuit values; calculating sets of simulation data for each equivalent circuit value; comparing sets of simulation data with the test data; and selecting one of the equivalent circuit values based on the comparison. This method allows all circuit parameters of each cell in a stack to be obtained from only one quick test.

10 Claims, 8 Drawing Sheets

U.S. PATENT DOCUMENTS

2003/0206021 A1    11/2003    Laletin et al.

OTHER PUBLICATIONS

Verbrugge MW, Schneider EW, Conell RS, Hill RF, The Effect of Temperature on the Equilibrium and Transport Properties of Saturated Poly(Pertluorosulfonic Acid) Membranes, Journal of the Electrochemical Society, 139 (12): 3421-3428 Dec. 1992.

Sumner JJ, Creager SE, Ma JJ; DesMarteau DD, Proton conductivity in Nafion (R) 117 and in a novel bis[(perfluoroalkyl)sulfonyl]imide ionomer membrane, Journal of the Electrochemical Society, 145 (1): 107-110 Jan. 1998.

Amphlett JC, Baumert RM, Mann RF, Peppley BA, Roberge PR, Harris TJ, Performance Modeling of the Ballard-Mark-IV Solid Polymer Electrolyte Fuel-Cell .1. Mechanistic Model Development, Journal of the Electrochemical Society 142 (1): 1-8 Jan. 1995.

Amphlett JC, Baumert RM, Mann RF, Peppley BA, Roberge PR, Harris TJ, Performance Modeling of the Ballard-Mark-IV Solid Polymer Electrolyte Fuel-Cell .2. Empirical-Model Development, Journal of the Electrochemical Society 142 (1 ): 9-15 Jan. 1995.

Junbom Kim, Seong-Min Lee, Supramanian Srinivasan, Modeling of Proton Exchange Membrane Fuel Cell Performance with an Empirical Equation, Journal of the Electrochemical Society, 142 (8): 2670-2674 Aug. 1995.

Chu D, Jiang R, Walker C, Analysis of PEM fuel cell stacks using an empirical current-voltage equation Journal of Applied Electrochemistry 30 (3): 365-370 Mar. 8, 2000.

Buchi FN, Srinivasan S, Operating proton exchange membrane fuel cells without external humidification of the reactant gases—Fundamental aspects, Journal of the Electrochemical Society 144 (8): 2767-2772 Aug. 1997.

Wagner N, Schnumberger W, Muller B, Lang M, Electrochemical impedance spectra of solid-oxide fuel cells and polymer membrane fuel cells Electrochimica Acta 43 (24): 3785-3793 1998.

Wagner N, Characterization of membrane electrode assemblies in polymer electrolyte fuel cells using a.c. impedance spectroscopy, Journal of Applied Electrochemistry, 32 (8): 859-863 Aug. 2002.

Li GC, Pickup PG, Ionic conductivity of PEMFC electrodes—Effect of Nafion loading, Journal of the Electrochemical Society,150 (11): C745-C752 Nov. 2003.

Larminie, J.R.J, Current interrupt techniques for circuit modelling; Electrochemical Measurement, IEE Colloquium on , 1994 pp. 12/1-12/6.

Lee CG, Nakano H, Nishina T, Uchida I, Kuroe S, Characterization of a 100 cm(2) class molten carbonate fuel cell with current interruption, Journal of the Electrochemical Society, 145 (8): 2747-2751 Aug. 1998.

Buchi FN, Marek A, Scherer GG, In-Situ Membrane Resistance Measurements in Polymer Electrolyte Fuel-Cells by Fast Auxiliary Current Pulses, Journal of the Electrochemical Society, 142 (6): 1895-1901 Jun. 1995.

Iqbal MT, Simulation of a small wind fuel cell hybrid energy system, Renewable Energy 28 (4): 511-522 Apr. 2003.

Iqbal MT, Modeling and control of a wind fuel cell hybrid energy system, Renewable Energy 28 (2): 223-237 Feb. 2003.

O'Hayre R, Fabian T, Lee SJ, Prinz FB, Lateral ionic conduction in planar array fuel cells, Journal of the Electrochemical Society, 150 (4): A430-A438 Apr. 2003.

Smirnova AL, Ellwood KR, Crosbie GM, Application of Fourier-based transforms to impedance spectra of small-diameter tubular solid oxide fuel cells, Journal of the Electrochemical Society, 148 (6): A610-A615 Jun. 2001.

Lufrano F, Staiti P, Minutoli M, Evaluation of nafion based double layer capacitors by electrochemical impedance spectroscopy Journal of Power Sources, 124 (1): 314-320 Oct. 1, 2003.

Lufrano F, Staiti P, Minutoli M, Influence of Nafion content in electrodes on performance of carbon supercapacitors, Journal of the Electrochemical Society, 151 (1): A64-A68 Jan. 2004.

Buller, S.; Karden, E.; Kok, D.; De Doncker, R.W., Modeling the dynamic behavior of supercapacitors using impedance spectroscopy, Industry Applications, IEEE Transactions on , vol. 38 , Issue: 6 , Nov.-Dec. 2002 pp. 1622-1626.

Belhachemi, F.; Rael, S.; Davat, B., A physical based model of power electric double-layer supercapacitors. Industry Applications Conference, 2000. Conference Record of the 2000 IEEE , vol. 5 , Oct. 8-12, 2000, pp. 3069-3076 vol. 5.

Gualous H, Bouquain D, Berthon A, Kauff mann JM, Experimental study of supercapacitor serial resistance and capacitance variations with temperature Journal of Power Sources 1 23 (1): 86-93 Sep. 15, 2003.

Emmenegger C, Mauron P, Sudan P, Wenger P, Hermann V, Gallay R, Zuttel A, Investigation of electrochemical double-layer (ECDL) capacitors electrodes based on carbon nanotubes and activated carbon materials Journal of Power Sources, 124 (1): 321-329 Oct. 1, 2003.

Zubieta, L.; Bonert, R., Characterization of double-layer capacitors for power electronics applications Industry Applications, IEEE Transactions on , vol. 36 , Issue: 1 , Jan.-Feb. 2000 pp. 199-205.

Zubieta, L.; Bonert, R., Characterization of double-layer capacitors (DLCs) for power electronics applications, Industry Applications Conference, 1998. Thirty-Third IAS Annual Meeting. The 1998 IEEE , vol. 2 , Oct. 12-15, 1998, pp. 1149-1154 vol. 2.

Buller S et al., Impedance-based simulation models of supercapacitors and Li-ion batteries for power electronic applications, Conference Record of the 2003 IEEE Industry Applications Conference. 38$^{th}$. IAS Annual Meeting. Salt Lake City, UT, Oct. 12-16, 2003.

Bard et al.. Electromechanical Methods—Fundamentals and Applications. Chapter 3—Kinetics of Electrode Reactions, pp. 86-118. John Wley & Sons. Copyright 1980.

Larminie et al., Fuel Cell Systems Explained, Chapter 3—Operational Fuel Cell Voltages, pp. 45-66. John Wiley & Sons, Inc., Copyright 2003.

* cited by examiner a) b)

METHOD OF TESTING AN ELECTROCHEMICAL DEVICE

CROSS-REFERENCE TO RELATED APPLICATIONS

The present application is a U.S. national phase application of PCT International Application No. PCT/NZ2005/000053, having an international filing date of Mar. 24, 2005 and claiming priority to New Zealand Application No. 531978, filed Mar. 26, 2004, the disclosures of which are incorporated herein by reference in their entirety. The above PCT International Application was published in the English language as International Publication No. WO 2005/093447.

FIELD OF THE INVENTION

The present invention relates to various methods and associated apparatus for testing an electrochemical device. Certain aspects of the invention relate to the testing of a fuel cell, but others are applicable to a range of devices, including (but not limited to) fuel cells and double-layer capacitors.

BACKGROUND OF THE INVENTION

1. Testing Procedures

Proton Exchange Membrane (PEM) Fuel Cell testing is wide ranging in terms of measured properties, and testing techniques. Testing objectives may include identifying specific properties, evaluating overall performance, or determining the state of a functioning fuel cell for control purposes. Measured fuel cell properties include individual loss terms, membrane hydration, and specific electrochemical properties such as the charge transfer resistance. A number of material properties, such as the membrane ionic resistance, have been measured ex situ using a variety of techniques [1, 2, 3]. However, most fuel cell testing is conducted on fully assembled, functioning cells or stacks. A review of current testing and analysis techniques used (including modelling) is given below.

The most common method of testing and characterising a PEM fuel cell is to obtain its steady state voltage versus current (VI) curve. The VI curve is generally obtained by holding the fuel cell operating conditions constant (such as the temperature, gas stoichiometry, and humidity) and measuring the voltage at set current values. The resulting VI curves are characterised by either mechanistic [4, 5] or empirical [6, 7] model equations, in order to obtain a general mathematical description of the fuel cell's performance.

Analysis of the VI curves and resulting model equations has also allowed individual loss terms to be inferred, such as the activation polarisation (initial steep decline of the VI curve), overall ohmic resistance (linear part of the VI curve), and mass transport loss (near the end of the VI curve). The way in which these loss terms (and hence VI curves) are affected by different operating conditions has also been studied, including the impact of different airflow rates or humidity levels [8]. A thorough VI evaluation requires accurate control over the stack power output and operating conditions. As a result, this fuel cell testing method is confined to a lab environment rather than an application setting.

AC impedance testing or Electrochemical Impedance Spectroscopy, (EIS) is also commonly employed for determining properties of a fuel cell. The technique consists of imposing a small AC sinusoidal current (or voltage) onto the fuel cell. The complex impedance is then derived by measuring the phase and amplitude of the corresponding voltage (or current) response. This test method has been conducted on a passive (non-functioning) fuel cell and an active (functioning) fuel cell, in which case an AC perturbation is superimposed onto DC load. Frequencies used typically range from 10 mHz to 100 kHz, in order to obtain a full spectrum of the AC impedance. In addition the fuel cell can be held at a number of different current densities for each impedance sweep to identify certain properties [9, 10].

It has been suggested that AC impedance testing is superior to steady state VI curve evaluation for separating out and identifying the different loss mechanisms of a fuel cell due to the association of loss mechanisms with certain frequency ranges [11]. For example, the charge transfer resistance has been associated with the high frequency region, while the mass transport losses are generally associated with lower frequency regions. [12].

Thus far, AC impedance testing has only been conducted on individual cells, and is aimed at obtaining discrete cell properties, rather than evaluating cell performance or functionality. Although complex test equipment is required, AC impedance testing has been suggested for stack testing (in which case AC impedance is carried out on each cell) in an application setting, thus providing information for active control and assessment of the fuel cell [13, 14].

Current interrupt or current pulse methods have been proposed as a potentially simpler technique for obtaining some fuel cell characteristics. These methods do not require an AC signal or measurement of the phase and magnitude of an AC response, which requires complex equipment. By examining the voltage transient generated when a functional fuel cell is subjected to a step change in current, the fuel cell resistance and other properties have been derived [15, 16]. The ohmic resistance seems to be the main property identified by this technique. However, other loss terms have been identified when a functioning Molten Carbonate Fuel Cell had been subjected to a current interrupt test [17]. A variation of this method involves subjecting a functioning fuel cell to a short duration current pulse [18]. In general, these testing methods, like AC impedance, are for determining specific fuel cell properties (primarily the resistance) rather than evaluating the general performance or functionality. Current interrupt techniques have also been suggested for implementation in a commercial application, through the use of a shunt [19].

In general, current fuel cell testing methods either evaluate fuel cell performance by simply running the stack over its operational range, or evaluate specific properties of the fuel cell using a few electronic test methods. Identification of a single loss term (although indicative) cannot be used to judge the full functionality of the cell. In other words, there is no link from identification of a single fuel cell parameter, to the impact this has in terms of total performance. Thus far, the only method of obtaining fuel cell functional information has been to operate the fuel cell at a number of operating points, and thus obtain its VI curve. However, this testing has not been implemented in an application setting, and essentially is restricted to a lab type environment.

The vast majority of the testing methods and analysis are based on a single cell, hence only the characteristics of a single cell are found. If a test is implemented on a stack, such as current interrupt test, only properties of the stack as a whole can be found, such as the overall resistance. A VI evaluation can evaluate all cells in a stack (with all cells being monitored) however, as stated above, this is a technique used only in a lab type environment.

2. Equivalent Circuit Models and Methods for Obtaining the Circuit Parameters

2.1 Introduction to Equivalent Circuit Models

Equivalent circuit modelling is a common way of representing an electrochemical device, such as a battery or an electrolysis cell. As fuel cell technology has progressed recently, more attention has been given to equivalent circuit modelling of fuel cells. The resulting equivalent circuit models are used for a number of purposes such as predicting a fuel cell's dynamic response under a load change. The circuit models and their corresponding circuit parameters have been determined using a variety of techniques, such as AC impedance (or Electrochemical Impedance Spectroscopy), current interrupt methods, and steady state VI evaluation. Much of the underlying theory and many of the techniques used are common to electrochemical cells in general.

2.2 Existing Fuel Cell Equivalent Circuit Models (Active Models)

One of the simplest and commonly used fuel cell equivalent circuit models (ECM's), is shown in FIG. 1a. This model is often referred to as the Randels equivalent circuit, and is a simple representation of any electrochemical cell. The model encapsulates the main properties of a fuel cell, which are the ohmic (or internal) resistance ($R_{int}$), activation loss (or charge transfer resistance, $R_{act}$), capacitive effect (C), and potential (E) due to the electrochemical reactions. While this model has been used for simulating the dynamic response of a fuel cell under a load change [20, 21], it is a simplistic representation, and captures just the main dynamics of a fuel cell.

One for the most commonly used ECM is shown in FIG. 1b, where the anode, cathode, and electrolyte properties have been separated [15]. The total resistance is divided between the ionic resistance of the membrane ($R_{ele}$), and the resistances associated with the anode ($R_a$) and cathode ($R_c$). The fuel cell capacitance is divided between the two charge layers created at the electrolyte/cathode interface ($C_c$), and the electrolyte/anode interface ($C_a$), (double charge layer effect). The fuel cell potential has also been divided between the half-cell reactions occurring at the anode and cathode. A number of current interrupt tests are proposed for parameter identification, however, as stated by Larminie, unique determination of anode and cathode properties can not be achieved by this technique alone. Although circuit component values are given for a number of different fuels, only an ideal voltage response to the current interrupt test had been presented, with no comparison to experimental results.

O'Hayre et al [22] used a similar model to that shown in FIG. 1b, however the electrode resistances are attributed to the activation loss present at the anode and cathode, and a single potential term was placed at the anode (FIG. 1c). The activation resistances at the electrodes were voltage dependant (encapsulating the non-linearity of the activation loss) and for simulation purposes were actually modelled as voltage dependant current sources. An additional resistor that connected the membrane of one cell to the membrane of an adjacent cell was added when a stack was being modelled. This additional resistor modelled lateral ionic conduction, a phenomenon that occurs when cells are in a planar configuration (common membrane electrolyte, with the cells externally connected in series. AC impedance and steady state VI curve testing was employed to derive the circuit parameters of the circuit model. In addition to these typical experiments, a number of open circuit experiments involving different planar configurations enabled losses at the cathode, and the magnitude of the lateral ion conduction to be identified. A simulation of the resulting ECM using P-Spice compared well with experimental results. However, only a steady state comparison between experimental and modelled results was made, negating the effect of the capacitors present in the model.

2.3 Existing Fuel Cell Equivalent Circuit Models (Passive Models)

In order to represent an additional loss attributed to limited mass transport (diffusion) present at the oxygen electrode (cathode), Wagner used an ECM containing an additional RC parallel branch (FIG. 2a) [9, 10]. Derivation of the model was achieved though AC impedance testing (electrochemical impedance spectroscopy), some of which was conducted while the fuel cell was in a passive state, with either oxygen or hydrogen present at both electrodes. Model validation was accomplished by comparing the AC impedance spectrum of a single cell with a simulated spectrum. However, this validation is somewhat unclear, as the capacitors in the ECM were replaced with constant phase elements and no circuit component values have been given.

One of the more complex models has been used by Li et al [11] (and references therein) which is the transmission line model of a single electrode. The electrode is modelled with an electronic resistance rail ($R_{ele}$), connected with capacitors (C) in parallel, to an ionic resistance rail ($R_{ionic}$). Only three $R_{ele}$—C—$R_{ionic}$ legs are shown in FIG. 2b), however, Li et al used a series of 40 when simulating the AC impedance response of the model. The objective of the paper was to investigate the ionic resistance as a function of distance. This function was found for a variety of electrodes by trial and error, using a comparison of the AC impedance spectrum to verify the function found.

Comparing the AC impedance spectrum between a fuel cell and model simulation is the most common way of verifying the validity of a particular ECM. The comparison of an AC impedance response is most often carried out directly, although the use of a Fourier transform of the impedance has also been suggested [23].

2.4 Equivalent Circuit Models of Double-Layer Capacitors (DLC)

The fuel cell models reviewed thus far, along with the techniques employed for circuit parameter identification, are primarily derived from the work conducted for a general electrochemical cell containing chemical reactants, such as a battery or an electrolysis cell. However, another electrochemical device that is very similar in construction to a fuel cell, and which exhibits a similar behaviour (particularly when a fuel cell is in a passive/non-functioning state) is a double-layer capacitor (DLC), also known as an electrochemical super capacitor, or super capacitor.

The basic construction of any DLC consists of two electrodes, separated by an electrolyte that contains free moving ions. Very large capacitances can be achieved due to the double charge layer formed at the electrode/electrolyte interface. This layer, where the charge separation between the ions in the electrolyte and the charge on the electrodes is very small, gives the electrolyte membrane a very large dielectric effect, thus making the capacitance of the whole device very large.

Activated carbon is most commonly used for the electrodes, as it is non-reactive, and large surface areas can be achieved. This is the same electrode material used in a PEM fuel cell. Usually, DLCs contain an organic based electrolyte, as this enables higher voltages to be used. However, aqueous $H_2SO_4$ is also been used (similar to the acid present in a PEM fuel cell) and a small number of DLCs employing Nafion (a polymer membrane common in PEM fuel cells) have been realised and their properties tested [24, 25].

While the construction of a DLC is very similar to other electrochemical cells (such as fuel cells and batteries), a DLC can be distinguished based on the type of processes occurring within it. In a DLC, only non-faradic processes can occur, such as the movement and adsorption of ions, whereas with other electrochemical cells, faradic processes also occur, i.e. electrochemical reactions due to a charge transfer between the electrolyte and the electrode. It has been reported that certain DLC capacitors store charge due in part to faradic processes (limited electrochemical reactions), however this is a minor effect compared to the charge stored from non-faradic processes. Due to the physical similarity between a PEM fuel cell and a DLC, it is fruitful to consider the circuit models and testing techniques used for these devices, particularly due to the fuel cell experimental methods considered below.

A DLC does not behave as an ideal capacitor; hence much work has been devoted to understanding and modelling the way in which the charge is stored, particularly with respect to the double charge layer. Along with a number of theoretically based mathematical models, a number of complex ECMs models have been proposed [25, 27], most of which contain numerous resistor and capacitor branches connected in parallel. However, a simple two branch model, as used by Goalous et al [28], has been shown to predict the essential characteristics of a DLC (see FIG. 3a).

The model contains a resistor ($R_p$) that accounts for the leakage current (or self-discharge), and two resistor and capacitor branches ($R_1C_1R_2C_2$), which are able to model the dynamic response of a DLC. Although an inductor (L) is shown, its value tends to be very low, and is only considered if high frequencies are being modelled. A feature of the model is the variable capacitance value of capacitor $C_1$. This well-known characteristic is due to the way a DLC stores charge, resulting in a capacitance value that increases linearly with voltage.

The methods employed for deriving DLC circuit parameters can roughly be divided into two groups, those employing AC techniques, and those employing DC techniques. AC methods (Electrochemical Impedance Spectroscopy) have been widely used [25, 26, 29] and are very similar to those discussed in relation to fuel cells, thus the discussion below will examine the DC methods.

The DC methods used are all very similar, and include measuring the transient voltage response to an imposed constant current charge, discharge, or sequence of charge/discharge steps. Goalous et al identified the R—C values based on the fact they possessed different time constants. This enabled two distinct voltage transients to be identified, and the circuit parameters could be obtained with minimal computation. Zubieta et al used a similar technique in finding the parameters to a 3 R—C branch model (FIG. 3b). Determination of the parameters using this method requires the initial voltage of the DLC to be zero (hence the initial voltage of the capacitors in the model will also be zero). In the case of Zubieta et al, the DLC was held at short circuit for a week for the zero initial voltage condition to be satisfied. While many of these DC type tests have been carried out, they are all quite similar, with the test and corresponding analysis being conducted across only one cell [27, 28, 30, 31].

2.5 Summary of Methods to Determine Circuit Parameters

In equivalent circuit modelling, the experimental methods and corresponding techniques used for parameter identification are only implemented on a single cell. Therefore, to test a stack, individual test on each cell would be required. Fuel cell circuit models and corresponding parameters are generally verified by comparing the simulated and experimental AC impedance spectrum or steady state VI data. DC techniques (such as applying a constant current) are used for validating super capacitors models along with AC methods.

SUMMARY OF THE INVENTION

Fuel Cell Testing Procedure

A first aspect of the invention provides a method of testing a fuel cell, the method including charging the fuel cell during a charge period; discharging the fuel cell during a discharge period; and monitoring the response of the fuel cell during at least part of the discharge period.

A second aspect of the invention provides a method of testing a fuel cell, the method including charging the fuel cell during a charge period; and after the charge period making the fuel cell open-circuit and monitoring the open-circuit response of the fuel cell.

The first and second aspects of the invention each obviate the need for complex test equipment required to generate and measure complex test signals, such as sine waves of varying frequency, a series of current pulses, or a current ramp.

The monitored response of the proposed testing procedure, is typically a voltage transient or a specific part of the voltage transient behaviour such as a rate change in voltage, or a step change in voltage resulting from a discrete change in the charge/discharge test condition. The monitored response can also included a current transient and/or any part of the current behaviour through the fuel cell during any part of the testing procedure. In general, the response can be anything that gives information about the fuel cell as a result of the testing protocol imposed.

The response of the fuel cell may also be monitored during at least one other period. The other period(s) may include the charge period and/or the discharge period and/or an initial period prior to any charge/discharge test process, and/or a self-recharge period after the discharge period. Monitoring during two or more periods provides additional information that can be used to provide a more complete picture of the physical nature/condition of the cell. For instance monitoring during the initial period can be used to determine initial equivalent circuit conditions indicative of an initial value of a time varying circuit condition (such as voltage).

Typically, the response of the fuel cell is measured during discharge into a test circuit including one or more passive test components, such as (but not limited to) resistors and capacitors. The benefits of using simple circuit components of known values is recognised, as no complex test circuitry is required. Measuring the response of the passive test component(s) also provides additional information. In the preferred test described below, the response of the components would include the voltage across $R_{1TC}$ during the charge up and the voltage across $R_{2TC}$ during the discharge. In this case monitoring $R_{2TC}$ during the discharge does not provide additional information, as this equals the voltage across the stack. However, if the fuel cell were discharge into a $R_{2TC}C_{2TC}$ then monitoring the voltage across $R_{2TC}$ would provide additional information.

Passive Fuel Cell Test

A third aspect of the invention provides a method of testing a fuel cell, the method including testing the fuel cell when the fuel cell is in a passive state in which substantially no electrochemical reactions are occurring in the fuel cell.

The third aspect of the invention recognizes the benefits in testing a passive fuel cell. As no substantial electrochemical reactions are taken place, the fuel cell can be charged and/or discharged in predominately a capacitor sense. In other words, faradic reactions do not occur, leaving only non-faradic processes.

The method is simpler than previous methods which require the fuel cell to be in an operative state with fuel and oxidant being passed though the cell and electrochemical reactions taking place. As a consequence, the passive fuel cell test could be implemented on a manufacturing line or in a stand-by power system (as stored hydrogen would otherwise have to be used, compromising back-up run time). In both cases the fuel cell is in a passive state. Testing a passive fuel cell also enables different characteristics of the fuel cell to be examined as the test results are not affected by electrochemical reactions taking place during the test. As a consequence, aspects more closely related with the fuel cell's physical condition or construction may be found.

Condition of the Fuel Cell

The methods of the first, second and third aspects of the invention may be used to assess certain aspects of a fuel cell, such as it's ability to function. Testing and measuring the electrical properties of a passive fuel cell (which behaves predominantly in a capacitive sense) could be related to the performance of the fuel cell when active. For example, if the passive test indicated a large capacitance of a cell, (indicating more surface area), this would indicate more reaction sites when active, thus increased performance. The passive test results could thus be related to the level of functionality of an active cell, and thus may be used to measure the level of health of a fuel cell.

Clearly it is recognised that not all factors affecting fuel cell performance can be found using a passive test. The test process only probes the electrical nature of the cell itself, thus only testing the physical properties of a cell. Aspects such as mass transport, flooding, or gas flow field effects, are simply not present. However, as changes in the condition of the fuel cell occur predominantly at the cell level, (such as degradation, or dehydration) the results from successive passive tests could be used to predict a change in the cell's state in an application setting.

The relationship between the passive test results and the active functionality of the fuel cell can be found by a comparative analysis of the passive results. By directly inspecting the results of a charge/discharge test (like those discussed above), a qualitative (or comparative) measure of cell properties can be gained, thus a correlation between the passive and active functionally of the stack could be found.

In one example, the direct results from the passive test could include a step change in cell voltage during part of the discharge period, or the rate of change in cell voltage during an open circuit period. In one fuel cell tested, it has been found that these measurements correlate with the active cell performance. Other testing methods require further computation of the fuel cell response, such as calculation of the fuel cell resistance from AC impedance or current interrupt techniques. The physical quantities once calculated, such as the resistance, are then used as an indicator of fuel cell performance or condition. However, other factors in addition to the quantity calculated, may affect the condition of the fuel cell. Hence an advantage in the above method is a possible direct correlation between the results of the passive fuel cell test, and the active performance.

Multiple Devices

A fifth aspect of the invention provides a method of testing two or more electrically connected electrochemical devices, the method including applying a single stimulus to the end terminals of the connected devices, and independently monitoring the response of each of the devices to the stimulus.

The fifth aspect of the invention enables a number of devices to be tested efficiently, since only a single stimulus and a single test circuit is required for all devices. The devices may be connected serially, in parallel, or a combination thereof.

The response of the device is typically monitored by measuring and storing a series of voltage readings. These voltage readings (measured across each electrically connected device) may then be further analyzed, if desired, to assess the condition of the device as described in the section above.

Algorithm for Acquiring Model Parameters of a Device

A sixth aspect of the invention provides a method of testing an electrochemical device, the method including obtaining test data from the device; obtaining two or more circuit values of an equivalent circuit model parameter; calculating a respective set of simulation data for each parameter value; comparing each set of simulation data with the test data; and selecting one of the parameter values based on the comparison.

The sixth aspect of the invention provides a systematic method of utilising the test data to arrive at accurate values of equivalent circuit model parameters. The test data is typically the measured response of the device when subjected to a test protocol, such as one of the methods of the first or second aspects of the invention. The simulation data is then calculated (e.g. using an electrical circuit simulation program such as PLECS) by simulating the test protocol acting on an equivalent circuit model of the device.

The equivalent circuit parameters may be indicative of the value of a circuit component (for instance a resistor or capacitor), or conditions indicative of an initial value of a time varying circuit condition, such as the initial voltage of a capacitor.

A seventh aspect of the invention provides a method of testing an electrochemical device, the method including obtaining test data from the device; and calculating parameters of an equivalent circuit model from the test data; wherein the parameters include
  a. one or more values, each being indicative of the value of a circuit component in an equivalent circuit model, and
  b. one or more conditions, each condition being indicative of an initial value of a time varying circuit condition.

The seventh aspect of the invention provides an alternative testing method, which calculates both circuit component values (for instance resistance and/or capacitance values) and initial condition values (for instance initial voltage values) associated with the equivalent circuit model. This can be contrasted with conventional methods which require (or assume) the initial conditions to be zero, for example, requiring the initial voltage of DLC to be zero, thus all initial voltage conditions of the model will be zero.

The sixth and seventh aspects of the invention may be performed on a variety of devices, including (but not limited to) a fuel cell or double-layer capacitor (DLC).

Provided the equivalent circuit model is derived based on the physical nature of the device being tested, the equivalent circuit parameter values will typically relate to physical properties of the device. This enables the values to be used directly in assessing the physical condition/state of the device. Current equivalent circuit models are either constructed to predict the terminal behaviour of a device, with no physical significance given to the components (particularly with respect to a DLC's). Whereas other equivalent circuits attempt to relate circuit components to physical properties (such as the fuel cell models), but do not fully predict the dynamic behaviour of the device.

BRIEF DESCRIPTION OF THE DRAWINGS

Embodiments of the invention will now be described by way of example with reference to the accompanying drawings, in which.

DESCRIPTION OF PREFERRED EMBODIMENTS

3. Testing Procedure 3.1 Introduction

A new testing method is proposed, which provides results that can indicate the relative performance of the individual cells within a fuel cell stack. The performance information is not obtained by operating the stack, but testing the stack while it is in a passive, non-functioning state. The test method and analysis is relatively simple, enabling it to be implemented in a number of situations. The testing method is described below with reference to a particular fuel cell. However the method may also be used to test other electrochemical devices such as Double Layer Capacitor (DLC).

3.2 Fuel Cell Testing

The testing method is implemented while the fuel cell is in a passive (non-functioning) state. No hydrogen is present in the stack, with both the anode and cathode compartments containing air. As a result, no potential can be formed across any of the cells. While the fuel cell stack is in this passive state, each cell predominately behaves as a DLC due to the similar physical structure between the two devices (as previously described in section 2.4). In both cases, a double charge layer can be formed at the electrode/electrolyte interface.

Figure 5:
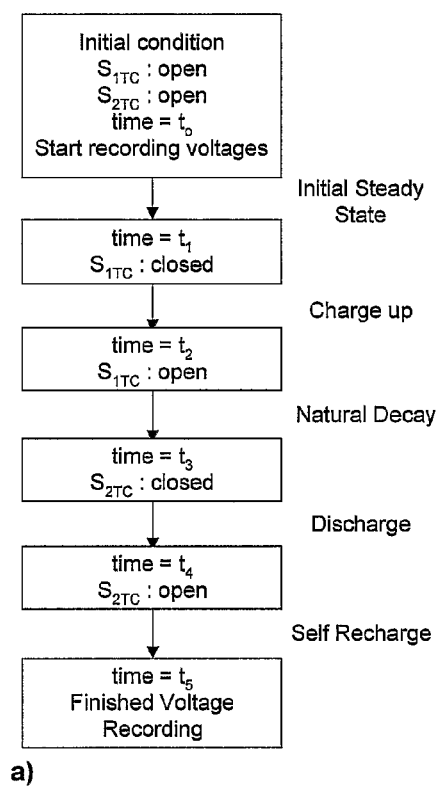
FIG. 5a) is a flow diagram showing the test protocol
FIG. 5b) shows the test circuit
Figure 5:
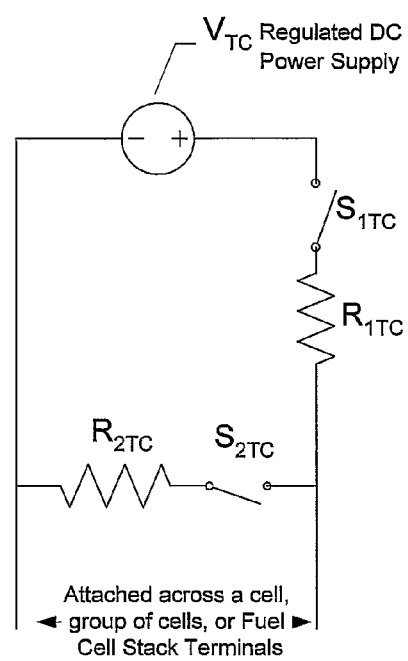

Using an electrical probing protocol shown in FIG. 5a), the fuel cell stack is effectively charged and discharged during the test procedure (exploiting the capacitive property of a passive fuel cell). The resulting transient voltage response of each individual cell in the stack is recorded and analysed to assess physical/electrical properties of the cells, and hence indicate the functionality of the stack.

Figure 4:
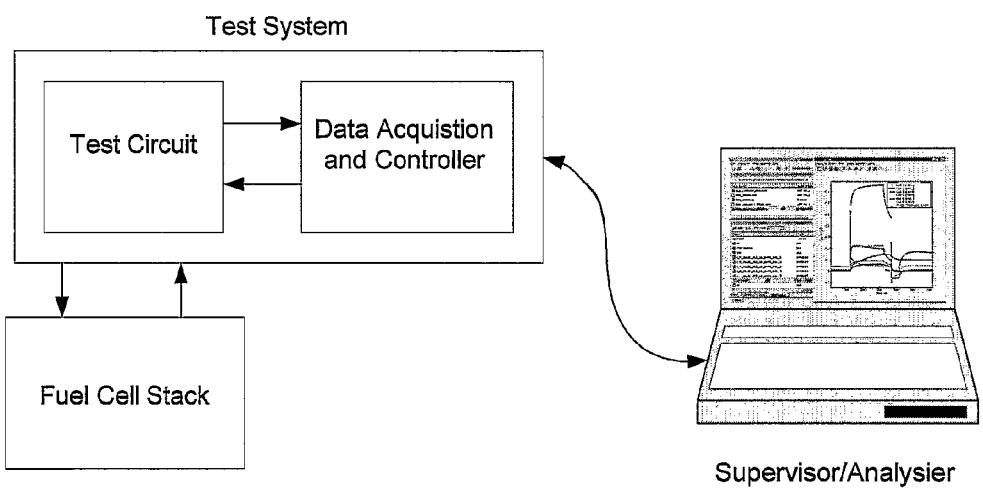
FIG. 4 shows testing apparatus for performing the invention

The electrical probing protocol is carried out by the test system, shown in FIG. 4. The test system includes a test circuit shown in detail in FIG. 5b) that can either apply a voltage to the stack in order to charge it, maintain the stack at open circuit, or allow a charge on the stack to be dissipated through a resistor. The test system also contains a data acquisition and controller module that measures the individual cell voltages and stack terminal voltage during the test procedure. The data acquisition and controller module also monitors and controls the test circuit. A PC based supervisor/analyser downloads a specific test protocol to the data acquisition and controller module, and analyses the test results to assess the stack.

The test protocol subjects the stack to a sequence of DC electrical conditions at the stack terminals, thereby charging and discharging the stack. The specific test protocol described here consists of five distinct periods;

1. The initial voltages of the cells and stack terminals are measured from time to until time $t_1$.
2. The stack is then charged up using a constant voltage source in series with the resistor $R_{1TC}$, over a time period from $t_1$ to $t_2$.
3. At time $t_2$, the voltage source is disconnected, and the fuel cell remains at open circuit until time $t_3$.
4. The remaining charge held by the fuel cell is then dissipated through the resistor $R_{2TC}$ in the time period $t_3$ to $t_4$.
5. The stack is once again held at open circuit, with the voltage of the cells and stack being recorded until time $t_5$ is reached, at which point the test procedure ends.

The data acquisition and controller module sets the time values $t_0$-$t_5$ (by controlling the switches $S_{1TC}$ and $S_{2TC}$), and it also sets the value of the regulated voltage source. Along with the voltages of the stack and cells being monitored throughout the test process, the voltage across $R_{1TC}$ is also monitored, thereby measuring the current flowing through the stack during the charge step. The details of the test protocol and other experimental details are described below.

3.4 Specific Experimental Embodiment

The testing procedure has been implemented on a small PEM fuel cell stack manufactured by MerCorp. The stack contained 6 cells stacked in series, each with an active area of 32 cm$^2$ and a Nafion based membrane. The stack design is completely symmetrical i.e. the gas flow-field design and electrode structures for the anode and cathode are identical. The test circuit component values were $R_{1TC}$=100Ω and $R_{2TC}$=4.9Ω, with $V_{TC}$ being set at a variety of values depending on what test was being implemented. For data acquisition and control, an HP 34970A Data Acquisition/Switch Unit was used, which contains an internal digital multi-meter for measurement purposes. The Data Acquisition/Switch Unit contained an HP 34901A 20-Channel Multiplexer card (enabling all of the cell voltages, stack terminals and the voltage across $R_{1TC}$ to be measured) as well as a HP 34907A Multifunction Module (which provided outputs for control of the test circuit). A P4m 2 GHz notebook computer running Matlab 6.5 R13 was used for supervisor/analyser purposes. The HP Data Acquisition/Switch unit was programmed directly in the Matlab environment, and communicated via an RS232 connection. Matlab was also used for analysing the voltage data, which was sampled at 1 Hz.

3.5 Fuel Cell Test Results

Figure 6:
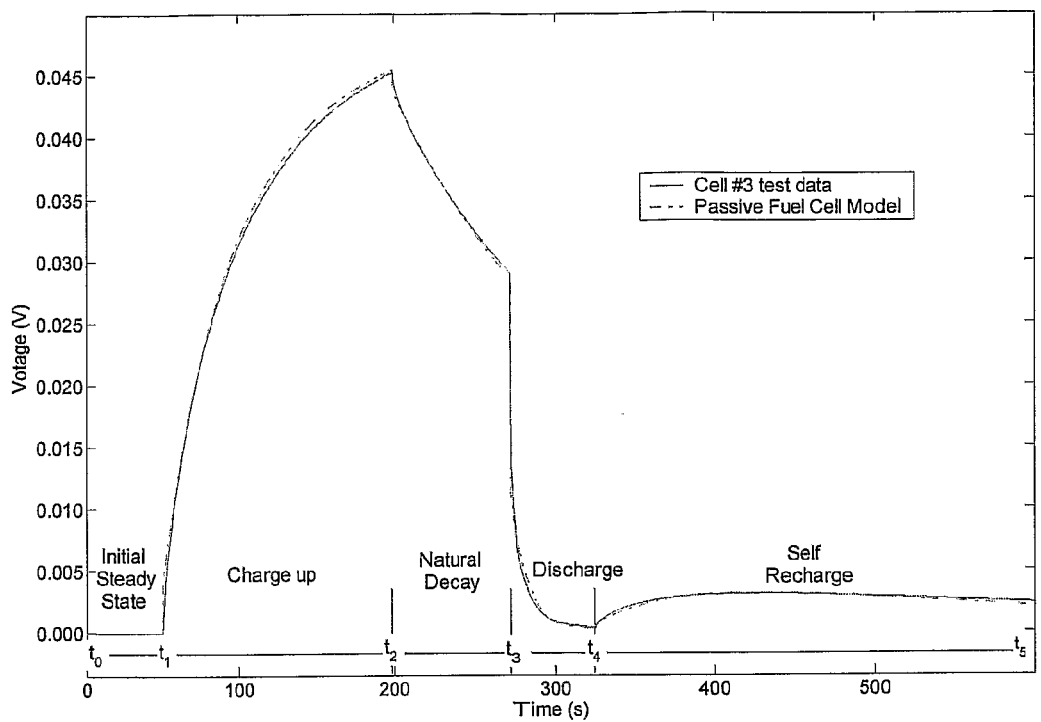
FIG. 6 shows a single cell voltage response when a single cell is subjected to the test protocol (electrodes of one cell attached to test circuit) and the corresponding modelled results

The general effect the testing protocol has on a fuel cell can be most easily observed by examining the response of a single cell. Thus, the test circuit was connected across cell #3 only, and the results (using $V_{TC}=0.05V$) are shown in FIG. 6.

The five parts of the test protocol creates five regions, which have been labelled as the initial steady state, charge up, natural decay, discharge, and self-recharge. A brief description of the phenomena occurring in the fuel cell and corresponding voltage response in each of the regions is given below.

1. Initial steady state ($t_0$-$t_1$): The stack is maintained at open circuit, and any potential that may initially be across the cell is recorded. In this case there is approximately 0 V across the cell initially.
2. Charge up ($t_1$-$t_2$): In this region, a voltage is applied across the cell (acting as a capacitor) in series with resistor $R_{1TC}$ as illustrated by FIG. 5b with $S_{1TC}$ closed. This results in an exponential type rise in the stack potential. The rise in the stack voltage is not a pure exponential function, as the fuel cell, (like a DLC) does not behave as an ideal capacitor.
3. Natural Decay ($t_2$-$t_3$): The voltage decays in an exponential type manner as a result of $S_{1TC}$ being opened. The voltage decay is due to electronic conductance of the membranes, (as the membranes are not perfect electronic insulators) and charge redistribution within the membrane. The presence of membrane electronic conduction can also be observed in the charge up region, as voltage across the fuel cell does not approach the applied voltage. Charge redistribution in the membrane is also responsible for the decay in voltage. As $H^+$ ions will continue to move from the negative to the positively charged electrode, this effectively increases the dielectric constant of the membrane, thus reducing the potential across the cell (assuming the charge remains near a fixed value).
4. Discharge ($t_3$-$t_4$): The remaining charge on the fuel cell is rapidly discharged through the resistor $R_{2TC}$. As the value of $R_{2TC}$ is small, the fuel cell is effectively short-circuited during this period, resulting in the voltage across the fuel cell approaching zero.
5. Self recharge ($t_4$-$t_6$): After the short is removed, the potential across the stack builds back up, and then begins to decay as in the natural decay region. This self-recharge is believed to be caused by a residual charge being held by the membrane even when there is little or no charge present on the electrodes. The residual charge is caused by the $H^+$ ions having a slow relaxation time, i.e. the distribution of $H^+$ ions will still be non-uniform in the membrane for some time after the charge on the electrodes has been reduced to zero. The non-uniformity in the $H^+$ distribution causes a potential across the cell to build once the short across the fuel cell has been removed. After a maximum voltage is reached in the natural recharge region, the charge across the fuel cell stack then naturally decays as in the natural decay region. Once again charge redistribution can explain the self recharge, as ions will continue to move to an equilibrium value, thus decreasing the effective dielectric constant of the membrane, and causing a rise in the potential (providing some electronic charge remains on the electrodes).

Figure 7:
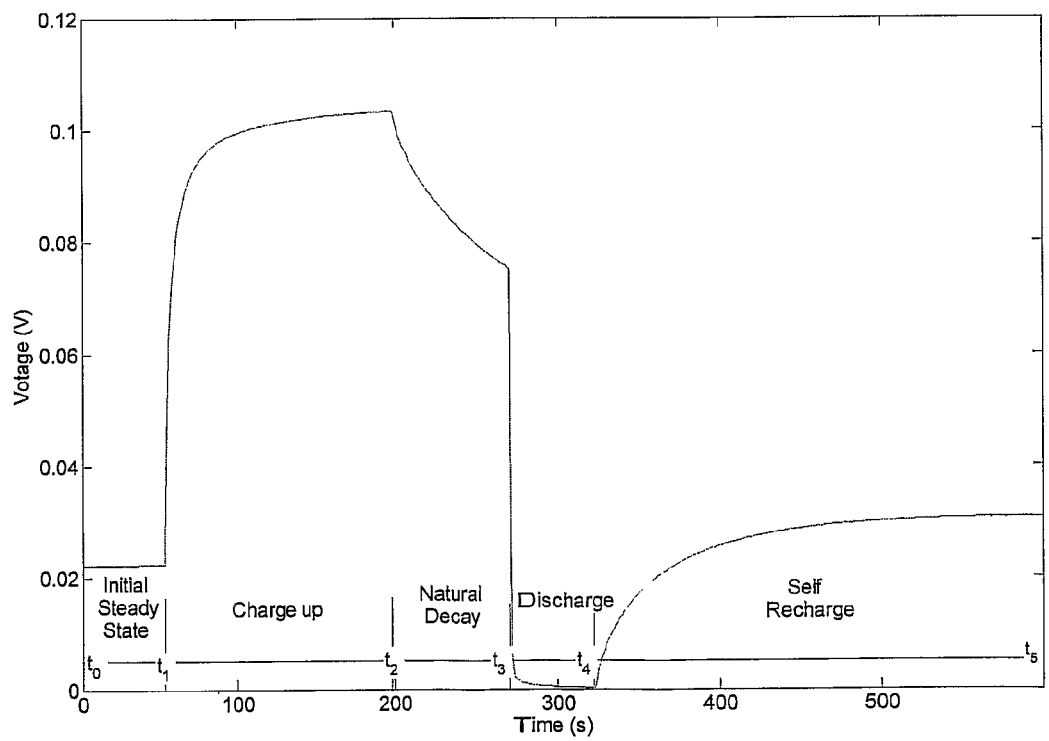
FIG. 7 shows the stack terminal voltage response when the stack is subjected to the test protocol (stack terminals attached to test circuit)

Note that if the test protocol were implemented across the entire stack, i.e. if the test circuit was connected across the stack terminals, the same transient voltage behaviour would be exhibited. This is shown in FIG. 7, where the same test procedure was implemented across the stack, with $V_{TC}=0.109V$. The combined behaviour of many cells stacked in series (6 in this case) happens to be the same as one cell on its own. However, when the test is implemented across the stack terminals, and the voltage across each cell is monitored, the voltage transient behaviour exhibited by each cell is quite different, as shown in FIG. 8.

Figure 8:
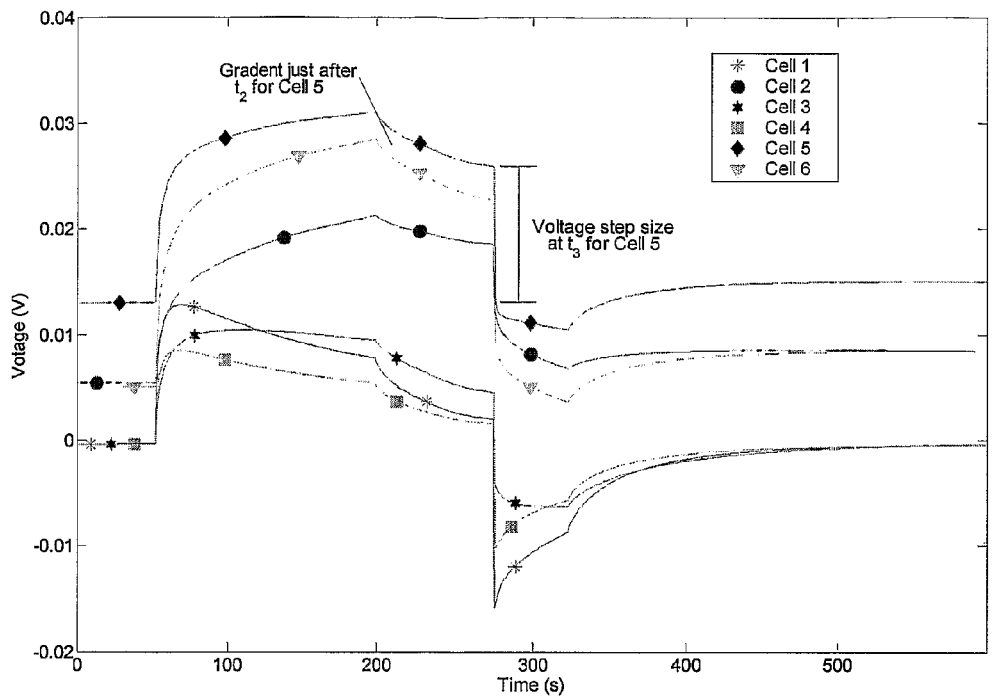
FIG. 8 shows the individual cell response when the stack is subjected to the test protocol (test circuit attached to stack terminals)

The voltage response of each cell shown in FIG. 8 has been taken from the same test as the result of the stack voltage. The sum of the cell voltages adds to give the stack terminal voltage response shown in FIG. 7. The wide range of cell voltage responses is caused by each cell possessing different capacitance, electronic conductance values etc. For example, Cell 5 exhibits a particularly low electronic conduction (a quality desirable in a cell), which is the reason the initial voltage was comparatively high at the start of the test, i.e. there is still a remaining charge across the cell from the previous day's operation. The variation of electrical properties amongst the cells, together with the cells interacting during the test process (as they are connected in series), produces the large range in voltage transient behaviour observed.

The different cell behaviours observed by the passive fuel cell test have been found to correlate with the individual cell performance (or their state of health) when the stack is active. In other words, the varied voltage response between the cells is caused by the same physical differences that cause the cells to function at different levels of health. As a result, the passive fuel cell test can be used for predicting the comparative functionality of individual cells within the stack. To demonstrate this, the fuel cell was operated after the passive test was conducted, and a correlation can be established between the operational functionality of each cell in the stack, and certain regions of the passive fuel cell test results.

3.6 Active Stack Experimental Details

In order to relate the outcome of the passive test to the functionality of the fuel cell, the operating conditions and acquisition of the VI curves were obtained in a way that limited changes to the state of the fuel cell. Thus a VI curve was obtained as soon as a certain degree of steady state had been achieved, ensuring the physical condition of the active fuel cell was as close as possible to the condition at which the passive fuel cell test was conducted. Due to these restrictions on the operation of the fuel cell stack, only low currents, and low powers were achieved. In addition, the stack was known to have performance issues, thus also contributing the low power levels achieved.

The VI curve of the fuel cell was taken at a stack temperature of 26.5° C., compared with 23.5° C. for the passive fuel cell test. The air (constant airflow rate of 1.3 l/min) was bubbled through distilled water, and entered the fuel cell at a temperature of 25° C., preventing possible dehydration. The Hydrogen (dead-ended, dry) and air were both slightly above atmospheric pressure, as they exited the fuel cell stack via a water column of equal height, ensuring near equal pressures at the anode and cathode.

Before the VI curves were obtained, the stack was allowed to come to a steady state defined as a change in voltage of less than $1.2 \times 10^{-3}$ V/s on any particular cell. This was achieved by operating the stack minimally, at a number of different currents, with steady state being achieved approximately 400 s from when hydrogen first entered the stack. A constant current load was used to obtain the VI curves. Three voltage readings of each cell were taken (over a period of 6 seconds) for a given current value, and the voltage readings were taken in order of increasing current. The resulting VI curves of each cell are shown in FIG. 9.

Figure 9:
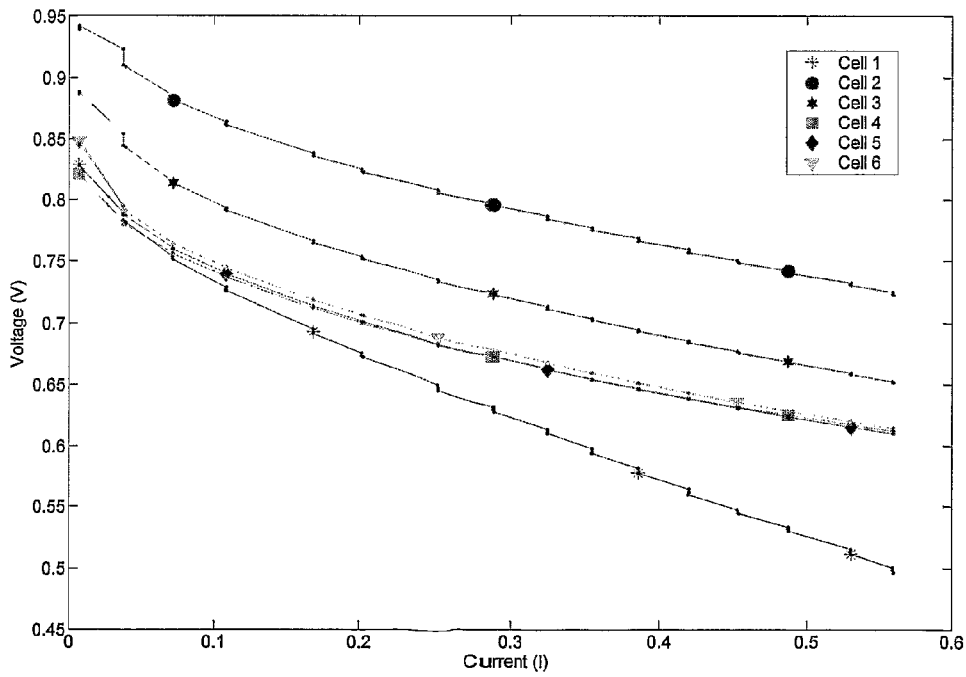
FIG. 9 shows the VI performance of the active stack

The VI curves in FIG. 9 show that each cell in the stack functions with a different level of performance or health. The healthiest cells produce a high voltage at a given current, thus, a simple way of quantifying the health of a cell is to use the voltage of the cell at a current of 0.56 A (listed below in table 1). As was claimed in a previous section above, the results of the passive fuel cell test can be used to indicate the performance (or health) of the cells. This prediction has been found by examining two areas of the passive fuel cell test results; the voltage rate of change (gradient) just after time $t_2$, and the size of the voltage step that occurs at $t_3$. These two quantities are shown for cell 5 in FIG. 8, and a list of the gradient, voltage step size, and the corresponding functional cell voltage of each cell are listed below in table 1.

TABLE 1

Passive Fuel Cell correlation with active stack performance.

| Cell # (in order of health) | Max V @ 0.560 A | Gradient at $t_2$ (V/s $10^{-6}$) | Size of the voltage step at $t_3$ (V $10^{-3}$) |
|---|---|---|---|
| 2 | 0.725 | −105 | 6.28 |
| 3 | 0.652 | −174 | 8.58 |
| 6 | 0.615 | −223 | 13.3 |
| 4 | 0.612 | −217 | 11.7 |
| 5 | 0.610 | −225 | 12.5 |
| 1 | 0.501 | −336 | 178 |

Table 1 shows that cells possessing a smaller gradient at $t_2$, and a smaller voltage step at $t_3$, correlate to healthier cells. Cells 4, 5 and 6 are very similar in their performance, so they present some discrepancy in the performance measurement. The process of conducting a passive test on the fuel cell, running the fuel cell, then comparing the performance with the gradient and voltage step has been repeated many times on this particular stack. Always a correlation could be seen between the passive and active set of results; however this was not always as clear as the correlation shown in table 1. Clearly, other operation factors can influence the performance of the cells but will not affect the results of the passive test (such as gas flow, and possible flooding of the cell). These aspects can influence the strength of the correlation observed. For the MerCorp stack, there were usually certain cells that performed very well, with the remainder of the cells performing marginally. The distinction between the groups of good cells and bad cells could always be identified from the passive tests.

It is interesting to observe the range in electronic conductivity of various cells, which can be inferred by the final voltage value of the charge up region of the passive results (the lower the voltage, the higher the electronic conductivity). While this would have an impact on cell performance (allowing a greater amount of parasitic current to flow), it cannot be used as an indicator of cell performance, as shown by the results.

Other areas of the passive test results could be investigated in order to reveal more about the condition of the fuel cell and how it will function when active.

3.7 Passive Testing and Active Correlation Summary

A new method of testing a proton exchange fuel cell has been proposed which is based on testing the fuel cell while in a passive state. Results of the passive test indicate the comparative health or functionality of individual cells when the fuel cell stack is active.

Cell heath status can be inferred directly from the behavioural trend of the test results, and requires minimal computational effort. The passive test is executed on the entire stack, as the test circuit is attached to the stack terminals. By recording the voltage transient on each cell during one test procedure, a comparative assessment can be made on each cell. Previous electronic test methods were either conducted on a single cell in order to identify its properties, or only net stack properties could be obtained if the test was conducted on the stack. This new approach has a number of possible uses. Due to its simplicity, it could be easily used in an application setting, particularly for a fuel cell stand-by system, where the fuel cell stack is in a passive state for most of the time. This test would provide a simple way to predict the performance of the stack before it becomes active. The test could also be employed as a quick check from a production line, enabling a quick indication of cell performance.

4. Equivalent Circuit Modelling

4.1 Introduction

Directly analysing the results of the passive test as shown in section 3, shows the potential value of the passive fuel cell test and how it can relate to the fuel cell characteristics and active functionality. A potentially more insightful method of analysing the results is to use an equivalent circuit model (ECM) as described in the prior art of section 2. Based only on the fuel cell being in a passive state, an ECM is investigated including a circuit parameter determination method.

4.1A Results and Discussion

The passive test method outlined above was implemented on a single cell with the test circuit being attached across cell #3 only. The values of the test circuit for this experiment were $R_{1TC}=100\Omega$, $R_{2TC}=4.9\Omega$ and $V_{TC}=0.05V$. The resulting voltage behaviour of cell 3 during the test procedure is shown in FIG. 7.

4.1B Explanation of Results and Formulation of ECM

The phenomena occurring in the cell during various parts of the test procedure, and how a corresponding passive fuel cell ECM (shown in FIG. 10) was inferred, is explained below.

Charge up ($t_1$-$t_2$): The first part of the curve is typical of a capacitor being charged with a constant voltage source in series with a resistor ($R_{1TC}$). Hence the ECM contains a capacitor, $C_1$.

Natural Decay ($t_2$-$t_3$): In the natural decay region (fuel cell at open circuit), the voltage declines as though the capacitor, $C_1$, is being discharged through a resistor. As a result, the ECM contains a resistor $R_p$, in parallel with $C_1$, representing the electronic conduction of the membrane. The resistance $R_p$ must not be confused with the membrane resistance presented in the other fuel cell models, as this resistance represents the conduction of $H^+$ ions through the membrane, not electrons.

Discharge ($t_3$-$t_4$): In the Discharge region, the voltage across the cell rapidly approaches zero as expected, due to the charge in the cell being dissipated through resistor $R_{2TC}$. As the resistor value $R_{2TC}$ is small, the cell is effectively short-circuited during this period.

Self recharge ($t_4$-$t_5$): When the stack is then open circuited after this rapid discharge (time=$t_4$), the voltage across the cell rises to a maximum value before decaying, hence this region is called the self recharge region. As stated in a previous section it is believed that this phenomenon is caused by the free moving ions in the membrane. When the cell is charged, the ions are forced away from the positive electrode and towards the negative electrode, thus creating the typical double charge layer at the electrolyte/electrode interface. Even though the charge of the electrodes can be reduced to zero rapidly (by shorting the cell), the uneven distribution of the ions in the membrane takes more time to reach a uniform distribution through diffusion. The uneven ion distribution still present when the short is removed forces a charge to build up on the electrodes. In order to model the self-recharge effect in the ECM, a capacitor and resistor in series ($C_2 R_2$) are placed in parallel across the first capacitor $C_1$. A possible interpretation of $R_2 C_2$ based on the explanation given above is that $R_2$ is somehow related to the resistance of the ions in the membrane, and $C_2$ is related to the added capacitance (dielectric effect) of the free moving ions. The final component of the model is resistor $R_1$, which is attributed to ohmic losses in the fuel cell, due to the electrodes, contact resistance etc.

4.2 Formulation of the Fuel Cell Equivalent Circuit Model

The goal when formulating an Equivalent Circuit Model (ECM) of the fuel cell is to derive the model from a physical standpoint of the fuel cell. This way, physical meaning can be placed on the circuit model parameters. To formulate the ECM, basic elements of the fuel cell (in a passive state) are considered. Initially, the electrodes (without a membrane) are considered, which in a PEM fuel cell are essentially two high surface-area conductors placed parallel to one another. This clearly means that a capacitor would have to be placed across the terminals of an equivalent circuit model. Thus, the fuel cell equivalent circuit model (shown in FIG. 10) has a capacitor $C_1$ across the cell terminals. The capacitance value of $C_1$ would be related to surface area and the separation of the electrodes. The membrane affects the characteristics of the cell (when in a passive state) in a number of ways. Firstly, the membrane is not a perfect electronic insulator, thus a resistor $R_p$ is added across $C_1$. The resistance $R_p$ must not be confused with the membrane resistance presented in the other fuel cell models, as this resistance represents the conduction of H$^+$ ions through the membrane, not electrons. The values of $R_p$ will depend on a number of things, not only the membrane, but also if the electrodes happen to be touching in an area due to some defect etc. The affect the membrane has on the total capacitance of the cell would be to increase it. Due to the mobile ions, (and the formation of a double charge layer), the membrane has a very large dielectric effect. Thus, in the equivalent circuit model, an additional capacitor $C_2$ is added in parallel to represent this increase in capacitance. In addition, as ions are subject to resistance in the membrane, a resistor, $R_2$ is placed in series with the capacitor. Finally, if many cells are to be connected, there will be electrical resistance between each cell, thus a resistor $R_1$ is placed in series with the circuit.

Figure 3:
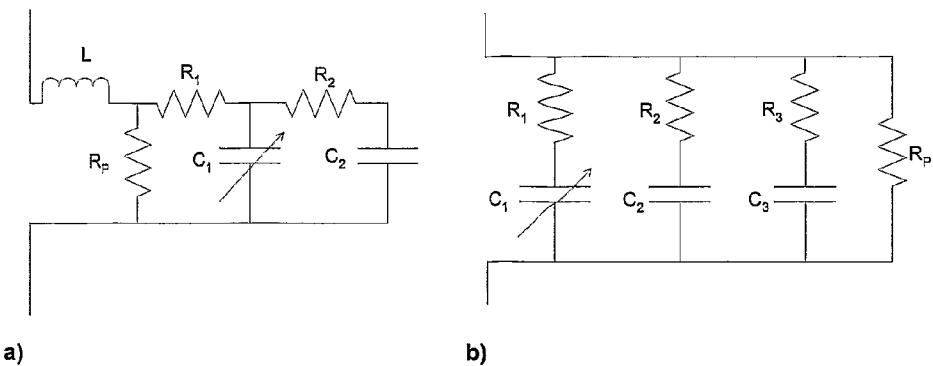
FIG. 3 shows a set of known equivalent circuit models for double layer capacitors (DLCs)
Figure 10:
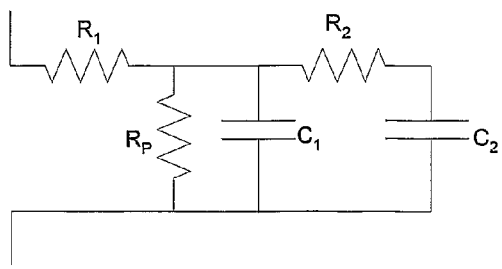
FIG. 10 shows an equivalent circuit model of a passive fuel cell

The passive fuel cell model shown in FIG. 10 is very similar to the existing model of a DLC, the only difference being the placement of a resistor $R_1$ (see FIG. 3a), and the non-variability of $C_1$. Based on the reasoning given above, placement of $R_1$ must be the first component in the circuit models (compared to the placement in a standard DLC ECM), as any current travelling through $R_p$ due to a charge, must pass through $R_1$. In DLC models, the variability in $C_1$ (due to the double charge layer) is also present in the passive model of a fuel cell. However, given the reasoning above, it would make more sense if the non-variability were placed on $C_2$, as $C_2$ was attributed membrane properties. The similarity between the passive fuel cell model and that of a DLC can be attributed to the fact that the fuel cell has the same basic construction as a DLC. In addition, as air is present at both of the fuel cell electrodes, and the test voltage is well below the level needed to electrolyse water (present in the membrane), no electrochemical reactions can occur during the test procedure. This leaves only faradic processes to occur in the fuel cell, which are the only processes that occur in a DLC. The model shown in FIG. 10 has been derived considering just the basic physical nature of a fuel cell, thus is relatively simple. A more complex model (such as one including voltage dependence capacitance) may be used, however the model is found to adequately model a passive fuel cell as shown is the next section.

4.3 Verification of the Passive Fuel Cell Equivalent Circuit Model

A circuit simulation program, PLECS (operating in the Matlab Simulink environment), was used to simulate the passive fuel cell model with circuit parameters shown in table 2 (derivation of circuit model values is described in section 4.5). Comparing the simulation and experimental results (experimental details given in section 3.4 3.5), it can be seen that the modelled data fits the experimental data with a good degree of accuracy (see FIG. 6). Hence the equivalent circuit model, inferred from considering the physical nature of a passive fuel cell, provides a good model of a passive fuel cell.

TABLE 2

| Circuit model values for cell # 3 | | | | | |
|---|---|---|---|---|---|
| Model parameter | $R_p$ | $R_1$ | $C_1$ | $R_2$ | $C_2$ |
| Passive FC model | 285 | 7.28 | 0.633 | 399 | 0.202 |

The way the circuit model is able to reproduce the voltage transient behaviour of a passive fuel cell test is briefly described below, with consideration being given to the physical interpretation of the circuit model components (as described in section 4.2).

1. Initial steady state: The Initial voltage values assigned to capacitors $C_1$ and $C_2$ in the circuit model, simulate the initial potential measured across the passive cell.
2. Charge up ($t_1$-$t_2$): In the charge up region, the voltage across the cell rises in an exponential like manner. The circuit model reproduces this voltage transient as capacitor $C_1$ is charged through the resistor $R_{1TC}$+$R_1$. The rise in voltage across the cell is not purely exponential, and the presence of $R_2 C_2$ and $R_p$ results in the modelled voltage rise not being a purely exponential also.
3. Natural Decay ($t_2$-$t_3$): The Natural decay in cell voltage is due to the internal conduction through the membrane, as well as the continued movement of H$^+$ ions in the membrane (as explained in section 3.5). The circuit model captures these two characteristics by having capacitor $C_1$ being discharged through resistor $R_p$, and $C_1$ being discharge into $C_2$ through resistance $R_2$.

4. Discharge ($t_3$-$t_4$): In the discharge region, the cell is connected across the discharge resistor $R_{2TC}$ and the potential drops rapidly in an exponential like manner. The circuit model captures this behaviour due to capacitor $C_1$ being discharge through $R_{2TC}$ thus the voltage across model reduces to a value close to zero. However, the charge on $C_2$ remains to some extent due the added resistance of $R_2$.

5. Self recharge ($t_4$-$t_5$): In the self recharge region, the potential across the cell builds to a maximum then decays as in the Natural Decay region. As explained in section 3.5, this voltage transient is due to a residual charge being held in the membrane. The equivalent circuit model reproduces this transient voltage behaviour as capacitor $C_2$ discharges into $C_1$ through $R_2$, thus increasing the potential across the cell as observed. As the resistor $R_p$ will continue to conduct, the potential across $C_1$ will build to a maximum before decaying, thus reproducing the complete voltage transient observed in the Self-recharge region.

4.4 Discussion

There are significant differences between the newly proposed ECM of a passive fuel cell (which is very similar to a DLC model) and fuel cell models proposed previously. Firstly, none of the existing fuel cell circuit models (passive or active) include electronic conduction of the membrane, which would be an additional loss term in an active fuel cell. It may be that the effect of membrane electronic conduction is only noticeable in the passive tests described, and other loss mechanisms, particularly hydrogen crossover, would mask the effects of the electronic conduction in an active fuel cell. As stated in section 3.4, the passive fuel cell test cannot test all properties of the fuel cell, and molecular Hydrogen crossover is one such property. However, electronic conduction of the membrane would always be present, even if it were very small, and may indicate other physical aspects of the fuel cell.

In all existing circuit models (excluding the very simple) at least two capacitors are placed in series, and are attributed to the individual charge layers present at the anode and cathode. This interpretation cannot be given to the passive fuel cell ECM, as the capacitors present in the model are placed in parallel. An alternative interpretation of the two capacitors has been proposed, in which one capacitor ($C_1$) representing the capacitance of the electrodes only, and the other capacitor ($C_2$) representing the added capacitance provided by the ions in the membrane (providing a dielectric effect). Clearly, only a passive model of a fuel cell is being proposed, thus differences are expected when comparing existing circuit models that are largely based on an active fuel cell. However, the validity of the existing models, (particularly when reduced to a passive model) are explored in section 4.8.

4.5 Method for Obtain the Model Values

Figure 14:
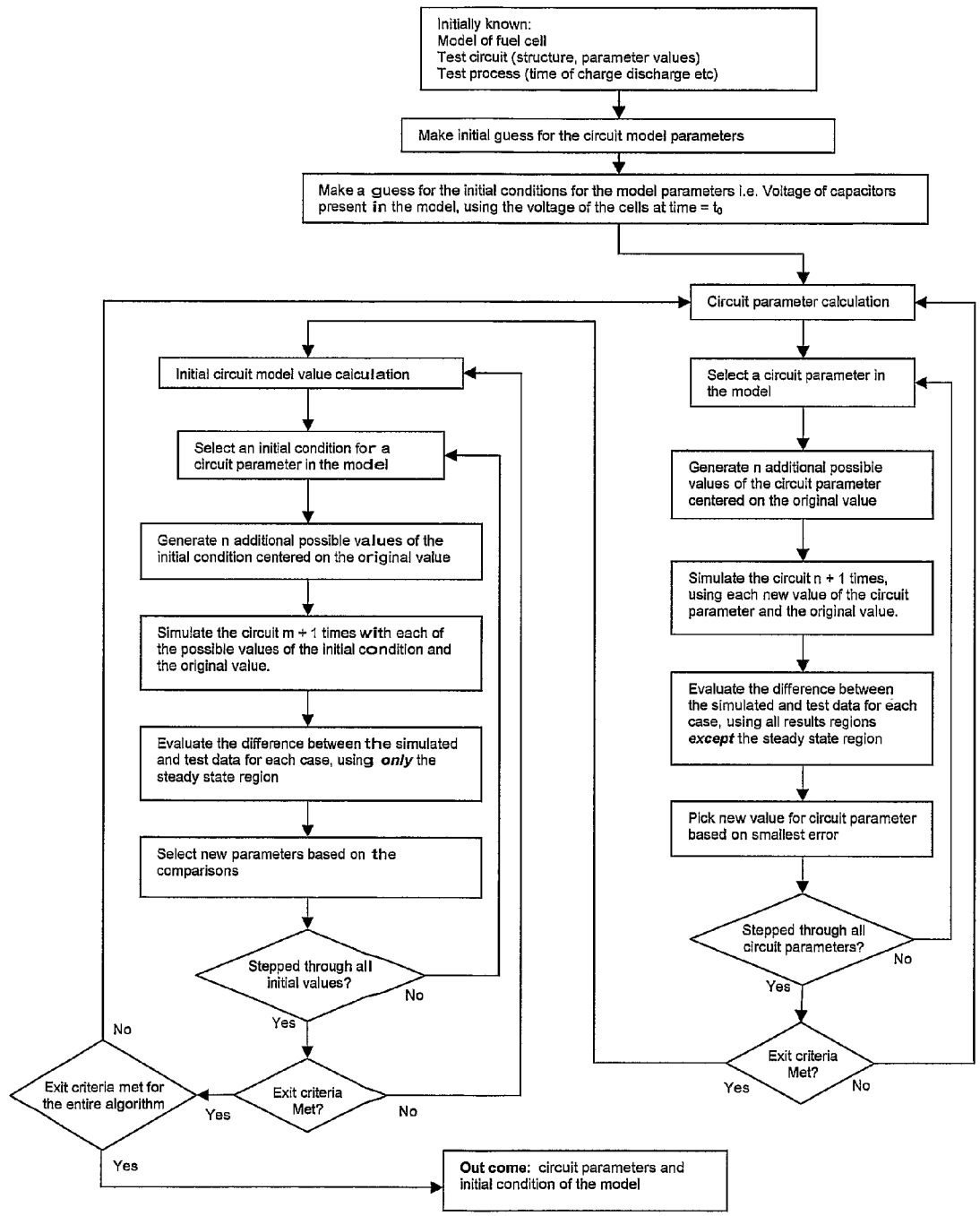
FIG. 14 shows an overview of the algorithm employed for circuit parameter determination.

PLECS, an electrical circuit simulator program that operates in the Matlab Simulink environment, is used for obtaining the circuit simulation results. To derive the circuit parameters, an algorithm was written in Matlab that uses the simulation results generate by PLECS. A simplified overview of the algorithm depicted in FIG. 14, shows there are two main parts, one for finding the circuit component values, the other for calculating the initial voltage condition of the capacitors in the model. The circuit model parameters are calculated by repeatedly stepping through each parameter, and successively selecting a value that reduces the error (in the least squares sense or by using another error calculation) between the simulated and experimental results. One method of selecting a new circuit value is to generate a set of possible values for a particular circuit parameter, simulate the model a number of times using each possible value, and then compare the error each simulation gives.

The set of values can be generated by multiplying the existing parameter value, say $R_2$, by a spread vector, i.e.

$$R_2 \times (0.75, 0.90, 0.99, 1.00, 1.01, 1.10, 1.25)$$

This gives 6 new values of $R_2$, plus the original value, i.e. n+1. The set of $R_2$ values this generates will consist of a large number centred on the original value, with a few more out lying. This pattern of possible values makes the algorithm converge to a solution. Changing the spread vector would change the algorithm convergence time and accuracy. For example, the addition of 0.995, and 1.005 would achieve a better fit, however the algorithm would take longer to converge.

The circuit is then simulated with each new value of the parameter. With each simulation of the circuit, the error between the actual test data and the modelled test data is recorded. A new parameter value is then chosen, based on the smallest error between the simulated and test data.

The same process is carried out for finding the initial voltage condition of the capacitors as for finding the circuit component values. The spread vector used for generating the set of circuit component values does not have to be the same as the one used for generating the set of initial voltage condition values, hence n and m values are given in the algorithm diagram. If the model of FIG. 10 is used, then only one initial condition needs to be found for a cell, which is the voltage of $C_2$ (the initial voltage of $C_1$ is measured directly at t0). However, if a different model is used, more than one initial condition may need to be found. Alternatively, when the initial values of the whole stack are needed, there are 6 $C_2$ values to find. As the algorithm determines the initial voltage condition of the model capacitors, this overcomes one of the problems with current methods of parameter identification, i.e. requiring an initial potential of 0V.

The algorithm converges to a solution when the original value for all parameters produces the smallest error. Using the spread vector given above, this implies that the algorithm converges to a solution when any change in any one of the variables by 1%, produces a larger error between the simulated and experimental data. A better fit between the simulated and experimental results can be achieved by reducing the 1% tolerance (thus changing the spread vector), but the 1% value was found to be an adequate compromise between solution accuracy and computation time. In addition, the circuit model used is still rather basic; hence, an identical fit (thus a unique solution) may not exist. The proposed method of finding the circuit parameters is flexible, in that any circuit model can be employed, including models containing voltage dependent capacitors.

4.6 Whole Stack Simulation

To further verify the equivalent circuit model, the test procedure was implemented on the entire stack (test circuit connected to the stack terminals) and the voltage response of each cell measured. The corresponding 6 celled stack model (using the parameters in Table 3) was simulated using PLEC, and the simulated (dashed line) and experimental (solid line) results are compared in FIG. 11.

TABLE 3

Circuit model values derived from test procedure using fitting algorithm

| Circuit parameter | $R_p$ | $R_1$ | $C_1$ | $R_2$ | $C_2$ |
|---|---|---|---|---|---|
| Cell 1 | 139 | 12.1 | 0.421 | 340 | 0.190 |
| Cell 2 | 1490 | 3.58 | 0.713 | 1160 | 0.100 |
| Cell 3 | 289 | 4.73 | 0.630 | 415 | 0.200 |
| Cell 4 | 108 | 7.74 | 0.656 | 220 | 0.272 |
| Cell 5 | 1200 | 10.3 | 0.558 | 197 | 0.392 |
| Cell 6 | 1700 | 8.18 | 0.469 | 386 | 0.239 |

Figure 11:
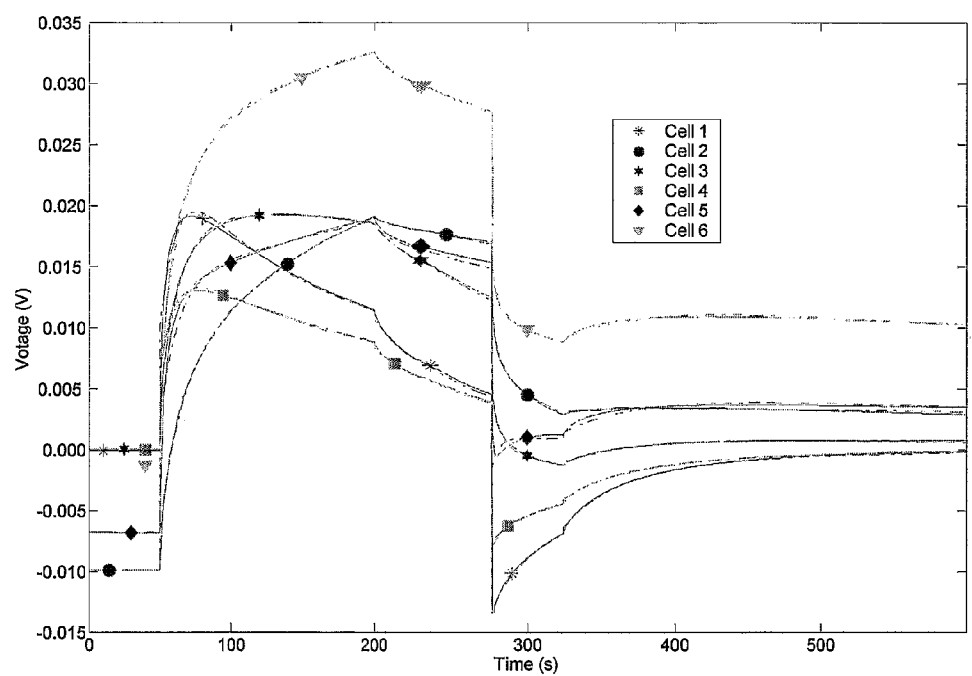
FIG. 11 shows the experimental and modelled data of the individual cell response to the test protocol

The advantage of obtaining the circuit parameters with the method described in section 4.5 is that it can be easily extended to find the parameters of each individual cell from the data shown in FIG. 11. This saves having to do individual tests on each cell, then individually obtaining the parameters of each cell. There are 30 circuit values to find, (5 for each of the 6 cells), and the computation time simply increases compared to finding the values of a single cell. Using the same convergence criteria, the circuit parameters were obtained (shown in table 3) and the simulation of the circuit with these parameters is also shown in FIG. 11. As can be seen, the simulated model results compare very well with the data from the stack.

4.8 Simulation of Existing Fuel Cell Models

Figure 1:
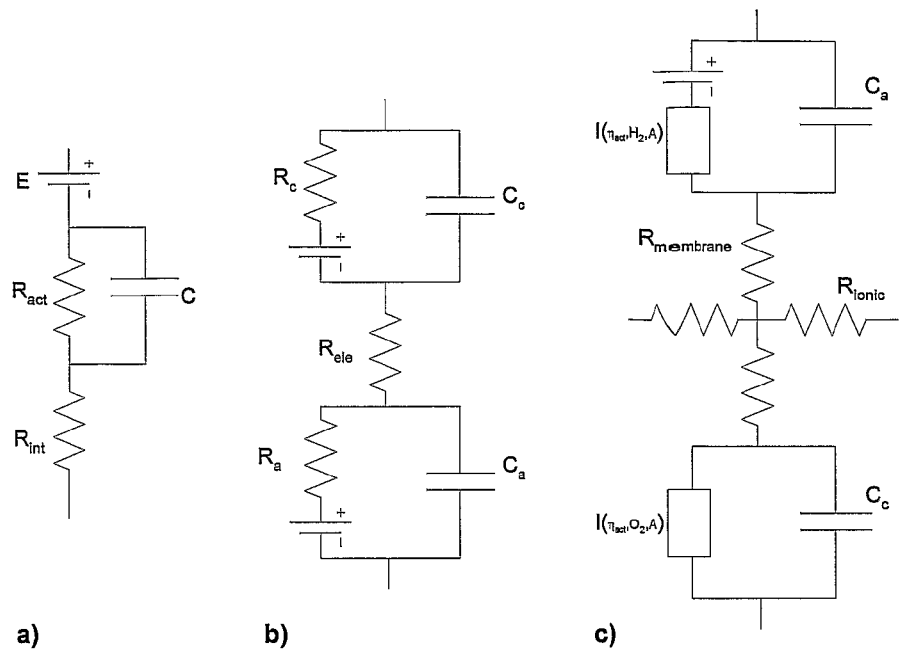
FIG. 1 shows a set of known equivalent circuit models for an active fuel cell
Figure 2:
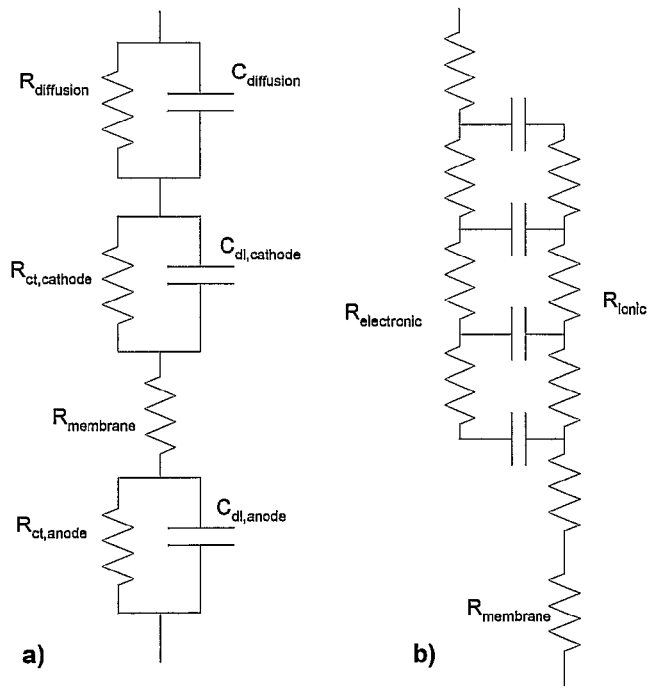
FIG. 2 shows a set of known equivalent circuit models for a passive fuel cell

It is interesting to compare how well the other models proposed in the literature are able to simulate the results of the passive fuel cell test as shown in FIG. 11. Hence, the same algorithm was employed to find the best solution of two additional fuel cell models, shown in FIGS. 12 and 13. In both cases, the fuel cell model simulated is based on the common ECM shown in FIG. 1b. However, as a passive fuel cell is being modelled, the voltage sources have either been regarded as an open circuit (shown in FIG. 12) or a closed circuit, (FIG. 13). In addition, a resistor representing the electronic conduction has been added, as this property has not been included in the original ECM of FIG. 1b. The model shown in FIG. 13 most probably represents a fuel cell in a passive state according to the reasoning behind the parameters in the original model, as the capacitor properties ($C_a C_c$) are still present for a passive fuel cell (representing the double charge layer at the anode and cathode), as is the with the ionic resistance ($R_{int}$) of the membrane. However, the other resistance present in FIG. 12 ($R_a R_c$), are generally attributed to the activation loss (charge transfers resistance), a phenomena that occurs only during electrochemical reactions, hence, not present while a fuel cell is in a passive state.

TABLE 4

Figure 12:
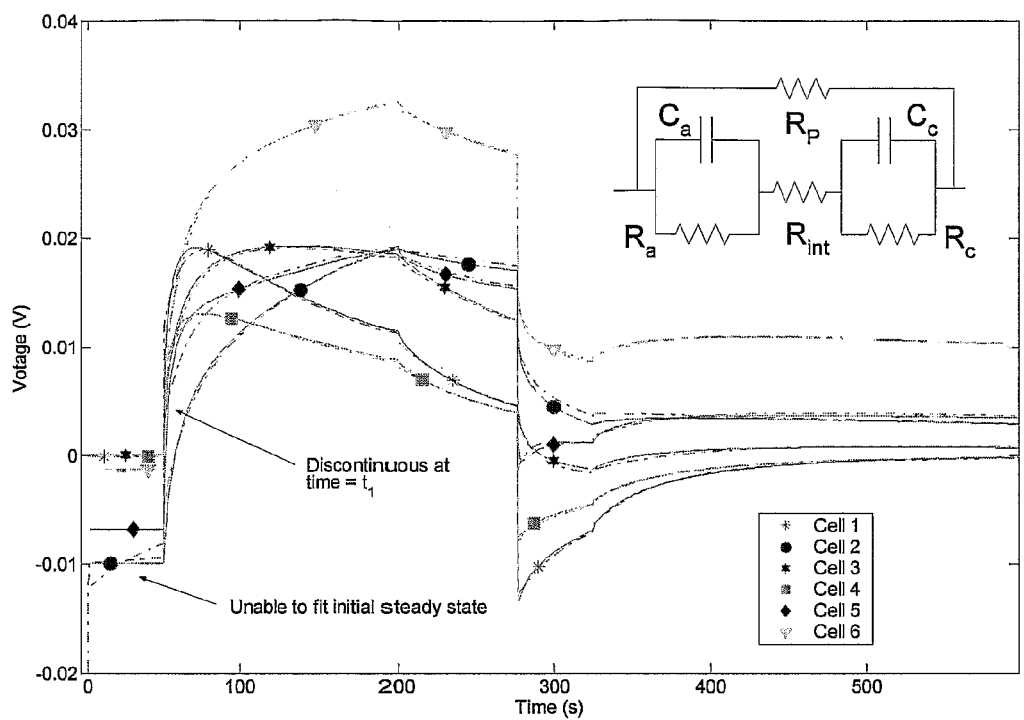
FIG. 12 shows the best fit of a standard equivalent model (see insert) to the experimental test data
Figure 13:
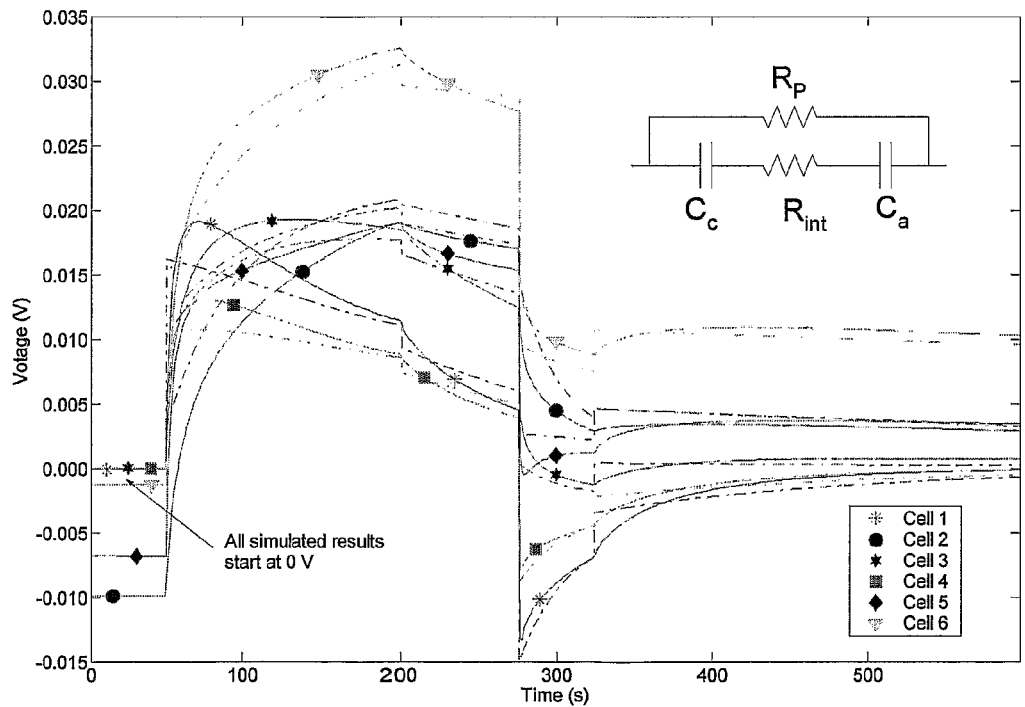
FIG. 13 shows the best fit of a standard equivalent model (see insert) to the experimental data

Circuit model values for the passive model shown in FIG. 12

| Circuit parameter | $R_p$ | $R_{int}$ | $C_a$ | $C_c$ | $R_a$ | $R_c$ |
|---|---|---|---|---|---|---|
| Cell 1 | 177 | 17.6 | 0.934 | 1.24 | 630 | 43.1 |
| Cell 2 | 2420 | 6.83 | 0.850 | 0.105 | 3110 | 0.0705 |
| Cell 3 | 3670 | 9.29 | 1.12 | 3.33 | 127 | 205 |
| Cell 4 | 195 | 11.1 | 1.58 | 1.91 | 209 | 27.6 |
| Cell 5 | 7878 | 15.2 | 1.07 | 2.04 | 1390 | 23.7 |
| Cell 6 | 6550 | 12.6 | 0.699 | 1.79 | 2490 | 30.5 |

TABLE 5

Circuit model values for the passive model shown in FIG. 13 Picture.doc

| Circuit parameter | $R_p$ | $R_{int}$ | $C_a$ | $C_c$ |
|---|---|---|---|---|
| Cell 1 | 146 | 42.7 | 2.34 | 1.47 |
| Cell 2 | 739 | 6.90 | 7.29 | 1.23 |
| Cell 3 | 344 | 22.1 | 1.71 | 2.48 |
| Cell 4 | 117 | 26.7 | 4.70 | 1.85 |
| Cell 5 | 761 | 23.8 | 1.96 | 2.51 |
| Cell 6 | 3060 | 30.5 | 1.44 | 1.76 |

Upon first glance, the ECM in FIGS. 12 and 13 may seem to capture the general behaviour of the passive fuel cell, however there are significant discrepancies. In FIG. 12, (which is the better fit of the two models) a major discrepancy is observed at the start of the charge region ($t_1$). The model results showed a very large voltage step at $t_1$ (difficult to see in the graph shown), which is not present in the experimental results. Also the initial steady state region of this simulation could not be matched to the experimental data. In addition, the model that would most represent the fuel cell in a passive state based on the physical interpretation given to its components (shown in FIG. 13) does not comprehensively capture the behaviour of the passive fuel cell.

4.9 Conclusion

A new equivalent circuit model has been proposed for modelling a passive PEM fuel cell. The model is similar to a DLC model apart for the placement of the resistor attributed to ohmic losses, and a constant capacitance is used, unlike the voltage dependent capacitance typically employed for a DLC (however a variable C may be attributed to $C_2$). The ECM has been validated in two ways. Firstly, by identifying the similarity between a fuel cell and DLC. This similarity is in the physical construction of the two devices and in the types of processes occurring in each device (i.e. only faradic processes, no electrochemical reactions). Comparing simulated and experimental test results has also validated the model. Not only did the model reproduce the behaviour of a single cell, but of many cells in series. A further confirmation of the model was shown when two additional passive ECMs (reduced from active stack models) could not simulate the response of the stack.

A new method of obtaining the circuit parameters of an equivalent circuit model has been proposed. The method employs an iterative algorithm, and compares passive fuel cell test results with simulation data. The algorithm is based on the results produced by the test procedure, and relies on the test procedure producing a unique set of voltage transits for each cell, from which a best-fit solution is obtained. The test procedure is different to other DC tests previously carried out, as it contains a number of different steps, which broadly may be stated in the following:

1. A procedure where the fuel cell stack is charged (in a capacitor sense with known external charge conditions)
2. The charged fuel cell is then allowed to interact with a number of additional passive circuit devices (in the detailed embodiment, open circuit→$R_{2TC}$→open circuit), which produces additional voltage transient behaviour.
3. An ECM with a unique set of parameters can reproduce the voltage behaviour from this test; hence an algorithm to find the parameters can be realised.

Although least squares fitting techniques have been used previously, they have only been employed match simulated and experimental AC impedance spectroscopy data.

This testing procedure and corresponding technique to obtain the circuit parameters can be applied to an entire stack.

All previous methods for finding the circuit parameters of a stack (or DLC) can only be implemented on a single cell. The new method proposed allows all circuit parameters of each cell in a stack to be obtained from only 1 test, which takes in the order of minutes complete. Due to these advantages, the passive test and circuit model analysis technique could have a number of uses. For example, a problem in manufacturing could be identified by conducting a passive fuel cell test off the production line, in conjunction with a circuit model analysis.

While the present invention has been illustrated by the description of the embodiments thereof, and while the embodiments have been described in detail, it is not the intention of the Applicant to restrict or in any way limit the scope of the appended claims to such detail. Additional advantages and modifications will readily appear to those skilled in the art. Therefore, the invention in its broader aspects is not limited to the specific details, representative apparatus and method, and illustrative examples shown and described.

Accordingly, departures may be made from such details without departure from the spirit or scope of the Applicant's general inventive concept.

5. References

1. Slade S, Campbell S A, Ralph T R, Walsh F C, *Ionic conductivity of an extruded Nafion* 1100 *EW series of membranes*, Journal of the Electrochemical Society, 149 (12): A1556-A1564 December 2002
2. Verbrugge M W, Schneider E W, Conell R S, Hill R F, *The Effect of Temperature on the Equilibrium and Transport Properties of Saturated Poly(Perfluorosulfonic Acid)Membranes*, Journal of the Electrochemical Society, 139 (12): 3421-3428 December 1992
3. Sumner J J, Creager S E, Ma J J; DesMarteau D D, *Proton conductivity in Nafion (R) 117 and in a novel bis[(perfluoroalkyl)sulfonyl]imide ionomer membrane*, Journal of the Electrochemical Society, 145 (1): 107-110 January 1998
4. Amphlett J C, Baumert R M, Mann R F, Peppley B A, Roberge P R, Harris T J *Performance Modeling of the Ballard-Mark-IV Solid Polymer Electrolyte Fuel-Cell .1.. Mechanistic Model Development*, Journal of the Electrochemical Society 142 (1):1-8 Jan. 1995
5. Amphlett J C, Baumert R M, Mann R F, Peppley B A, Roberge P R, Harris T J *Performance Modeling of the Ballard-Mark-IV Solid Polymer Electrolyte Fuel-Cell .2. Empirical-Model Development*, Journal of the Electrochemical Society 142 (1): 9-15 Jan. 1995
6. Junbom Kim, Seong-Min Lee, Supramanian Srinivasan, *Modeling of Proton Exchange with an Empirical Equation*, Journal of the Electrochemical Society, 142 (8): 2670-2674 August 1995
7. Chu D, Jiang R, Walker C *Analysis of PEM fuel cell stacks using an empirical current-voltage equation* Journal of Applied Electrochemistry 30 (3): 365-370 March 2000
8. Buchi F N, Srinivasan S, *Operating proton exchange membrane fuel cells without external humidification of the reactant gases—Fundamental aspects*, Journal of the Electrochemical Society 144 (8): 2767-2772 August 1997
9. Wagner N, Schnurnberger W, Muller B, Lang M, *Electrochemical impedance spectra of solid-oxide fuel cells and polymer membrane fuel cells* Electrochimica Acta 43 (24): 3785-3793 1998
10. Wagner N, *Characterization of membrane electrode assemblies in polymer electrolyte fuel cells using a.c. impedance spectroscopy*, Journal of Applied Electrochemistry, 32 (8): 859-863 August 2002
11. Li G C, Pickup P G *Ionic conductivity of PEMFC electrodes—Effect of Nafion loading*, Journal of the Electrochemical Society, 150 (11): C745-C752 November 2003
12. Bard A J, Faulkner L R, *Electrochemical Methods: Fundamentals and Applications*: second edition, New York: John Wiley, c2001
13. U.S. Pat. No. 6,214,487 B1, Kelley; Ronald J. (Coral Springs, Fla.); Mulligan; Robert J. (Lauderhill, Fla.); Pratt; Steven D. (Plantation, Fla.); Muthuswamy; Sivakumar (Plantation, Fla.); Landreth; Bobby Dean (Fort Lauderdale, Fla.); Pennisi; Robert W. (Boca Raton, Fla.) *Integral sensors for monitoring a fuel cell membrane and methods of monitoring*
14. U.S. Pat. No. 6,519,539 B1 Freeman; Norman A. (Toronto, CA); Masse; Stephane (Toronto, CA); Gopal; Ravi B. (Toronto, CA); Rivard; Pierre (Toronto, CA) *Measurement of fuel cell impedance*
15. Larminie, J. R. J *Current interrupt techniques for circuit modelling*; Electrochemical Measurement, IEE Colloquium on, 1994 Page(s): 12/1-12/6
16. James Larminie, Andrew Dicks *Fuel cell systems explained*, Chichester [England]; New York: Wiley, c2000. (get the 2003 copy)
17. Lee C G, Nakano H, Nishina T, Uchida I, Kuroe S, *Characterization of a 100 cm(2) class molten carbonate fuel cell with current interruption*, Journal of the Electrochemical Society, 145 (8): 2747-2751 August 1998
18. Buchi F N, Marek A, Scherer G G, *In-Situ Membrane Resistance Measurements in Polymer Electrolyte Fuel-Cells by Fast Auxiliary Current Pulses*, Journal of the Electrochemical Society, 142 (6): 1895-1901 June 1995
19. U.S. Pat. No. 6,620,538 B2 Bai; Lijun (Spokane, Wash.); Lott; David R. (Spokane, Wash.); Martin; Vanell L. (Spokane, Wash.) *Method and Apparatus for monitoring equivalent series resistance and for shunting a fuel cell*
20. Iqbal M T, *Simulation of a small wind fuel cell hybrid energy system*, Renewable Energy 28 (4): 511-522 April 2003
21. Iqbal M T, *Modeling and control of a wind fuel cell hybrid energy system*, Renewable Energy 28 (2): 223-237 February 2003
22. O'Hayre R, Fabian T, Lee S J, Prinz F B, *Lateral ionic conduction in planar array fuel cells*, Journal of the Electrochemical Society, 150 (4): A430-A438 April 2003
23. Smirnova A L, Ellwood K R, Crosbie G M, *Application of Fourier-based transforms to impedance spectra of small-diameter tubular solid oxide fuel cells*, Journal of the Electrochemical Society, 148 (6): A610-A615 June 2001
24. Lufrano F, Staiti P, Minutoli M *Evaluation of nafion based double layer capacitors by electrochemical impedance spectroscopy* Journal of Power Sources, 124 (1): 314-320 Oct. 1 2003
25. Lufrano F, Staiti P, Minutoli M, *Influence of Nafion content in electrodes on performance of carbon supercapacitors*, Journal of the Electrochemical Society, 151 (1): A64-A68 January 2004
26. Buller, S.; Karden, E.; Kok, D.; De Doncker, R. W.; *Modeling the dynamic behavior of supercapacitors using impedance spectroscopy*, Industry Applications, IEEE Transactions on, Volume: 38, Issue: 6, November-December 2002 Pages: 1622-1626
27. Belhachemi, F.; Rael, S.; Davat, B. *A physical based model of power electric double-layer supercapacitors*. Industry Applications Conference, 2000. Conference Record of the 2000 IEEE, Volume: 5, 8-12 Oct. 2000, Pages: 3069-3076 vol. 5

28. Gualous H, Bouquain D, Berthon A, Kauffmann J M, *Experimental study of supercapacitor serial resistance and capacitance variations with temperature* Journal of Power Sources 123 (1): 86-93 Sep. 15 2003
29. Emmenegger C, Mauron P, Sudan P, Wenger P, Hermann V, Gallay R, Zuttel A *Investigation of electrochemical double-layer (ECDL) capacitors electrodes based on carbon nanotubes and activated carbon materials* Journal of Power Sources, 124 (1): 321-329 Oct. 1 2003
30. Zubieta, L.; Bonert, R. *Characterization of double-layer capacitors for power electronics applications* Industry Applications, IEEE Transactions on, Volume: 36, Issue: 1, January-February 2000 Pages: 199-205
31. Zubieta, L.; Bonert, R.; *Characterization of double-layer capacitors* (DLCs) *for power electronics applications*, Industry Applications Conference, 1998. Thirty-Third IAS Annual Meeting. The 1998 IEEE, Volume: 2, 12-15 Oct. 1998, Pages: 1149-1154 vol. 2

The invention claimed is:

1. A method of testing a fuel cell, the method including charging the fuel cell during a charge period; discharging the fuel cell during a discharge period; monitoring the response of the fuel cell during at least part of the discharge period; and calculating one or more equivalent circuit values in accordance with the monitored response of the passive fuel cell, wherein the one or more equivalent circuit values include a first resistance value as a first component in an equivalent circuit model that represents electrical resistance between each fuel cell and fixed first capacitance value representing a capacitance across terminals of the fuel cell.

2. A method according to claim 1 wherein the response of the fuel cell is monitored by monitoring a step change in the voltage across the fuel cell during the at least part of the discharge period.

3. A method according to claim 1 further including making the fuel cell open-circuit after the charge period, and monitoring the open-circuit response of the fuel cell.

4. A method according to claim 1 wherein the fuel cell is discharged during the at least part of the discharge period through one or more passive test components.

5. A method according to claim 3 wherein the open-circuit response of the fuel cell is monitored by monitoring the rate of change of voltage across the fuel cell.

6. Apparatus for testing an electrochemical device, the apparatus being programmed to perform a method according to claim 1.

7. An apparatus configured to perform the method of claim 1.

8. A method according to claim 1 wherein the one or more equivalent circuit values further include a second resistance value that represents a resistance of a membrane of the fuel cell, a third resistance value that represents a resistance to the movement of ions in the membrane, and a second capacitance value representing a dielectric effect of the membrane.

9. A method according to claim 1 wherein the equivalent circuit values further include a second resistance value that represents a resistance of a membrane of the fuel cell and the first capacitance value is in parallel with the second resistance value.

10. A method according to claim 1 wherein the equivalent circuit values further include a third resistance value in series with a second capacitance value, where the third resistance value represents a resistance to the movement of ions in the membrane and the second capacitance value represents the dielectric effect of the membrane, wherein the first capacitance value is in parallel with a series arrangement of the third resistance value and second capacitance value.

* * * * *